(12) United States Patent
Tanaka et al.

(10) Patent No.: US 9,246,304 B2
(45) Date of Patent: Jan. 26, 2016

(54) PULSE SHAPING DEVICE AND PULSE SHAPING METHOD

(71) Applicant: Sony Corporation, Tokyo (JP)

(72) Inventors: Kenji Tanaka, Kanagawa (JP); Michio Oka, Tokyo (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 14/101,523

(22) Filed: Dec. 10, 2013

(65) Prior Publication Data
US 2014/0177661 A1    Jun. 26, 2014

(30) Foreign Application Priority Data

Dec. 25, 2012 (JP) ................. 2012-280736

(51) Int. Cl.
| | |
|---|---|
| H01S 3/10 | (2006.01) |
| H01S 5/00 | (2006.01) |
| H01S 5/14 | (2006.01) |
| H01S 5/065 | (2006.01) |
| H01S 5/40 | (2006.01) |
| H01S 5/50 | (2006.01) |

(52) U.S. Cl.
CPC ............... *H01S 5/0057* (2013.01); *H01S 5/141* (2013.01); *H01S 5/0064* (2013.01); *H01S 5/0657* (2013.01); *H01S 5/4006* (2013.01); *H01S 5/50* (2013.01)

(58) Field of Classification Search
CPC ..... H01S 3/005; H01S 3/2308; H01S 5/0657; H01S 5/0057; H01S 5/141; H01S 5/0064; H01S 5/4006; H01S 5/50; H01S 3/094; H01S 3/094076

USPC ............ 372/25, 28, 18, 30, 32; 359/237, 242, 359/337.2, 618, 290–292, 198, 223–225, 359/245, 260–263, 298, 295, 301–303, 359/317–318, 726–731; 398/39, 140, 118, 398/141

See application file for complete search history.

(56) References Cited

U.S. PATENT DOCUMENTS

| | | | | |
|---|---|---|---|---|
| 6,272,156 | B1 * | 8/2001 | Reed et al. ...................... 372/25 |
| 7,400,658 | B1 * | 7/2008 | Spinelli et al. .................. 372/22 |
| 2007/0268951 | A1 * | 11/2007 | Holtom ......................... 372/106 |
| 2011/0222289 | A1 * | 9/2011 | Yamamoto et al. ........... 362/259 |
| 2012/0147457 | A1 * | 6/2012 | Fujimoto et al. ........... 359/337.5 |
| 2012/0307620 | A1 * | 12/2012 | Oka et al. ................. 369/112.27 |
| 2014/0002890 | A1 * | 1/2014 | Jauregui Misas et al. .... 359/326 |

FOREIGN PATENT DOCUMENTS

| | | |
|---|---|---|
| JP | 2002-502061 | 1/2002 |
| JP | 2009-271528 | 11/2009 |

* cited by examiner

*Primary Examiner* — Jessica Stultz
*Assistant Examiner* — Delma R Forde
(74) *Attorney, Agent, or Firm* — Hazuki International, LLC

(57) ABSTRACT

There is provided a pulse shaping device including a pulse generator configured to generate pulsed light by using a semiconductor laser for emitting light of a predetermined wavelength, and an optical member provided in a subsequent stage of the pulse generator and configured to compress a pulse time width of the pulsed light. The pulsed light has a first frequency dispersion state. The optical member imparts a second frequency dispersion state to the pulsed light, the second frequency dispersion state being a frequency dispersion state opposite to the first frequency dispersion state.

8 Claims, 10 Drawing Sheets

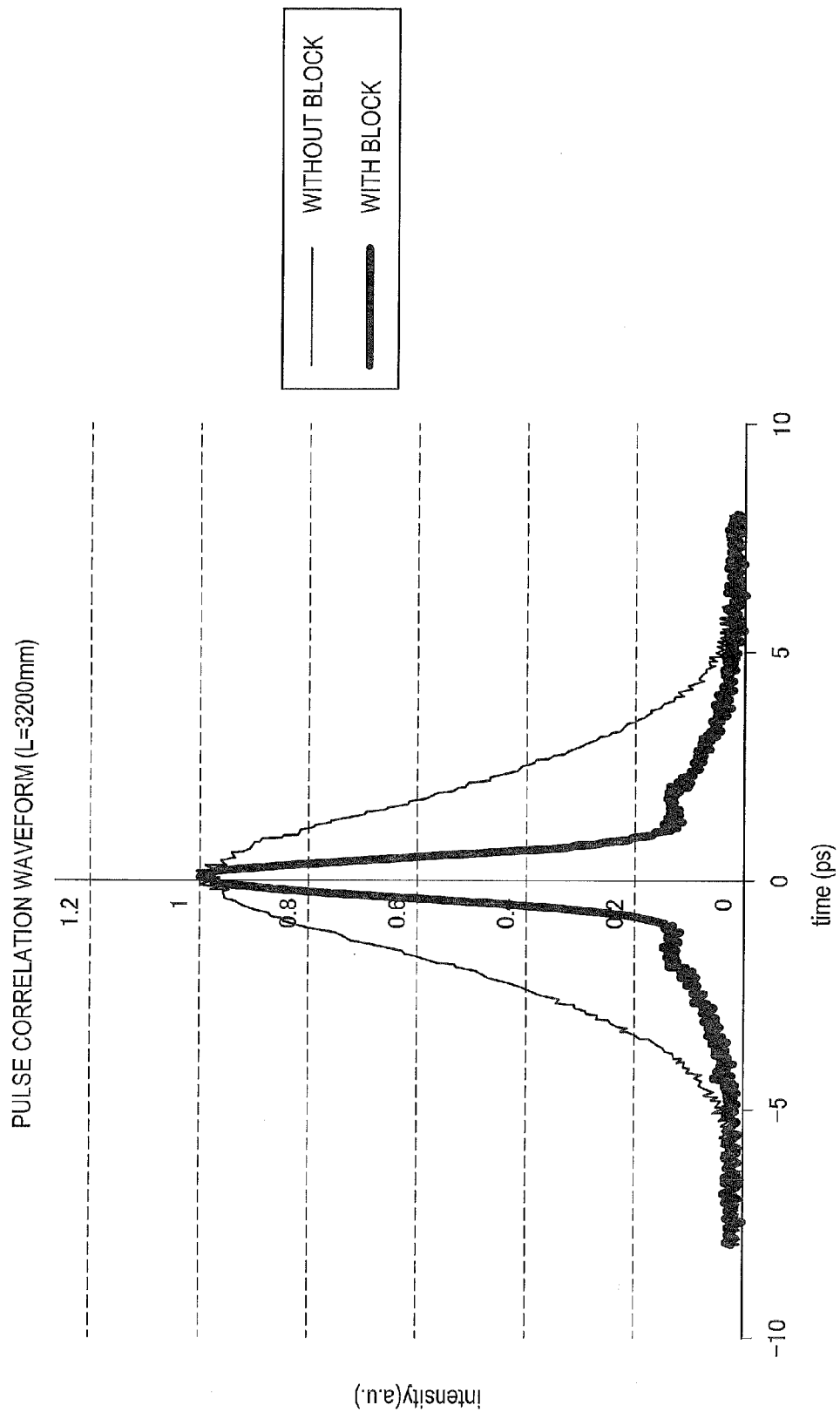

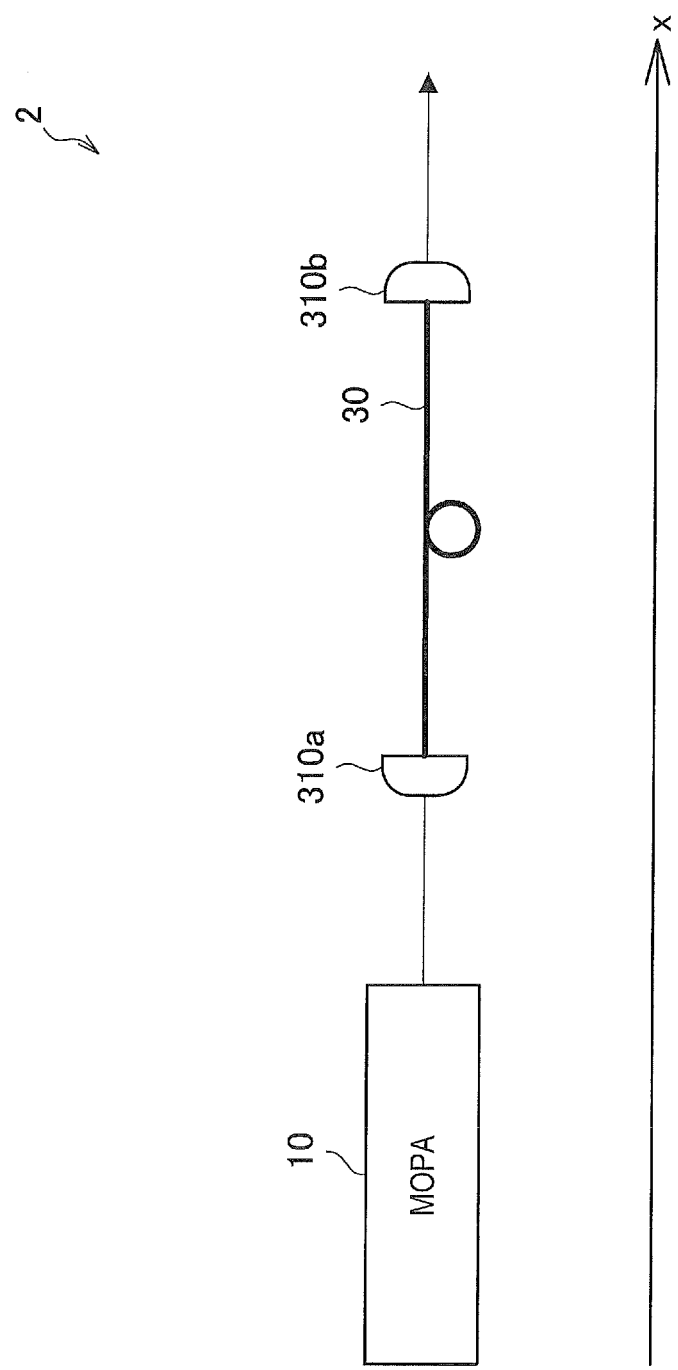

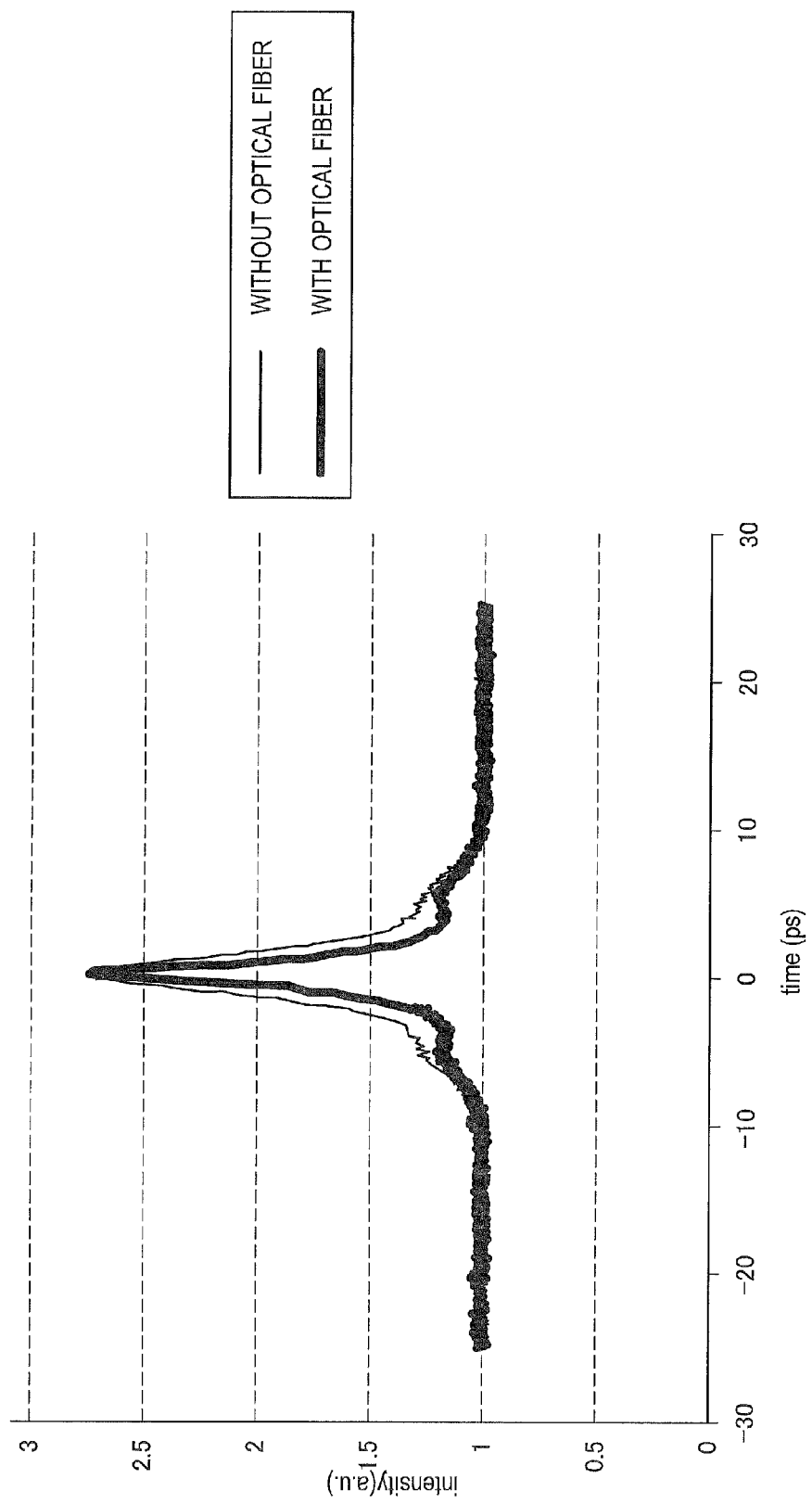

PULSE SHAPING DEVICE AND PULSE SHAPING METHOD

CROSS REFERENCES TO RELATED APPLICATIONS

The present application claims priority to Japanese Priority Patent Application JP 2012-280736 filed in the Japan Patent Office on Dec. 25, 2012, the entire content of which is hereby incorporated by reference.

BACKGROUND

The present disclosure relates to a pulse shaping device and a pulse shaping method.

In the field of machining of precision parts and optical communication, a pulse laser (pulsed light) in which light with a certain pulse time width is emitted at regular intervals is widely used. A solid-state laser such as Ti:Sa laser is generally often used as a master laser of such pulsed light.

It is possible to increase peak power (peak intensity) by performing pulse compression and shortening a pulse time width for the pulsed light. As a method of pulse compression, for example, a method of using a prism pair (pair of prisms) or a grating pair (pair of diffraction gratings) is known.

Furthermore, for example, Japanese Unexamined Patent Application Publication (Translation of PCT Application) No. 2002-502061 discloses a technique for performing pulse compression by propagating pulsed light within a block member that is made of a material such as tellurium oxide ($TeO_2$), zinc sulfide (ZnS), or zinc selenide (ZnSe). Moreover, Japanese Unexamined Patent Application Publication No. 2009-271528 discloses a technique for performing pulse compression by combining a graded-index (GRIN) fiber lens and a pulse-compressing fiber.

SUMMARY

However, the pulse compression techniques disclosed in Japanese Unexamined Patent Application Publication (Translation of PCT Application) No. 2002-502061 and Japanese Unexamined Patent Application Publication No. 2009-271528 employ optical members other than a compressor, such as the pulse expander or GRIN fiber lens, and thus a device thereof has a complicated and large-sized structure.

Furthermore, in recent years, a semiconductor laser has been widely used as a laser element, and an attempt has been made to use a semiconductor laser as a master laser of pulsed light. The pulse compression techniques disclosed in Japanese Unexamined Patent Application Publication (Translation of PCT Application) No. 2002-502061 and Japanese Unexamined Patent Application Publication No. 2009-271528 are techniques for pulsed light using a solid-state laser as a master laser, and thus there is a possibility that a sufficient pulse compression is not performed for pulse light using a semiconductor laser.

Therefore, an embodiment of the present disclosure provides a novel and improved pulse shaping device and pulse shaping method capable of performing pulse compression for the pulsed light using a semiconductor laser with a simple structure.

According to an embodiment of the present disclosure, there is provided a pulse shaping device including a pulse generator configured to generate pulsed light by using a semiconductor laser for emitting light of a predetermined wavelength, and an optical member provided in a subsequent stage of the pulse generator and configured to compress a pulse time width of the pulsed light. The pulsed light has a first frequency dispersion state. The optical member imparts a second frequency dispersion state to the pulsed light, the second frequency dispersion state being a frequency dispersion state opposite to the first frequency dispersion state.

According to an embodiment of the present disclosure, there is provided a pulse shaping device including a pulse generator configured to generate pulsed light by using a semiconductor laser for emitting light with a wavelength ranging from 350 nm to 500 nm, a quartz glass block provided in a subsequent stage of the pulse generator, and a mirror disposed on at least one of previous and subsequent stages of the quartz glass block and configured to reflect pulsed light emitted from the pulse generator. The pulsed light propagates through an inside of the quartz glass block only along a predetermined optical path length by being reflected by the mirror.

According to an embodiment of the present disclosure, there is provided a pulse shaping device including a pulse generator configured to generate pulsed light by using a semiconductor laser for emitting light with a wavelength ranging from 350 nm to 500 nm, a single-mode optical fiber provided in a subsequent stage of the pulse generator, a first lens configured to guide the pulsed light to the single-mode optical fiber, and a second lens configured to emit the pulsed light from the single-mode optical fiber.

According to an embodiment of the present disclosure, there is provided a pulse shaping method including generating pulsed light by using a semiconductor laser for emitting light of a predetermined wavelength, and compressing a pulse time width of the pulsed light by allowing the pulsed light to pass through an inside of an optical member. The pulsed light has a first frequency dispersion state. The optical member imparts a second frequency dispersion state to the pulsed light, the second frequency dispersion state being a frequency dispersion state opposite to the first frequency dispersion state.

According to one or more embodiments of the present disclosure, pulsed light generated by using a semiconductor laser passes through an optical member for imparting the second frequency dispersion state that is a frequency dispersion state opposite to the first frequency dispersion state of the pulsed light, thereby allowing the pulse time width of the pulsed light to be compressed.

According to one or more of embodiments of the present disclosure described above, it is possible to perform pulse compression for the pulsed light using a semiconductor laser with a simple structure.

Additional features and advantages are described herein, and will be apparent from the following Detailed Description and the figures.

BRIEF DESCRIPTION OF THE FIGURES

FIG. 7B is a diagram illustrating the effect of pulse compression by the pulse shaping device according to the first embodiment of the present disclosure;

FIG. 9 is a schematic diagram illustrating an exemplary configuration of a pulse shaping device according to a second embodiment of the present disclosure; and FIG. 10 is a diagram illustrating the effect of pulse compression by the pulse shaping device according to the second embodiment of the present disclosure.

DETAILED DESCRIPTION

Figure 1:
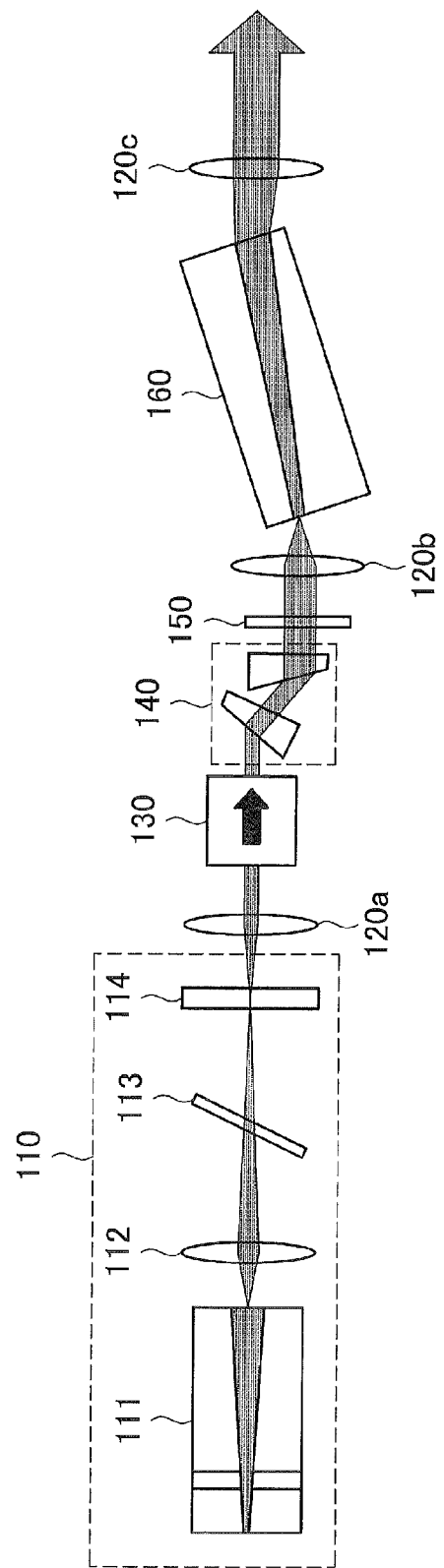
FIG. 1 is a schematic diagram illustrating an exemplary configuration of a pulse generator having an MOPA system.

Hereinafter, preferred embodiments of the present disclosure will be described in detail with reference to the appended drawings. Note that, in this specification and the appended drawings, structural elements that have substantially the same function and structure are denoted with the same reference numerals, and repeated explanation of these structural elements is omitted.

A description will be made in the order presented below.
1. Consideration on Pulse Compression for Pulsed Light using Semiconductor Laser
   1.1. Configuration of Pulse Generator (MOPA)
   1.2. Pulse Compression Method
2. First Embodiment
3. Second Embodiment
4. Summary <1. Consideration on Pulse Compression for Pulsed Light Using Semiconductor Laser>

In order to make the present disclosure more readily understood, the reason why the present disclosure have been conceived by the present inventors will be described.

As disclosed in Japanese Unexamined Patent Application Publication (Translation of PCT Application) No. 2002-502061 and Japanese Unexamined Patent Application Publication No. 2009-271528, much researches have been made on the technique for performing pulse compression on the pulsed light generated by using a solid-state laser. However, it was not necessarily clear whether a technique similar to the case of a solid-state laser is applicable or not to the technique for performing pulse compression on the pulsed light generated by using a semiconductor laser.

Thus, the present inventors have considered pulse compression for the pulsed light using a semiconductor laser. Specifically, the present inventors have considered a pulse shaping device and pulse shaping method that performs pulse compression by combining a pulse generator and an optical member. The pulse generator is configured to generate pulsed light by using a semiconductor laser that emits light of a predetermined wavelength, and the optical member is provided in a subsequent stage of the pulse generator and compresses a pulse time width of the pulsed light. In the following, the pulse generator and the optical member will be described in order.

[1.1. Configuration of Pulse Generator (MOPA)]

A pulse generator according to an embodiment of the present disclosure includes a so-called MOPA (Master Oscillator Power Amplifier) system. The MOPA system is the system in which a mode-locked laser diode (MLLD) for allowing a semiconductor laser to be operated in the form of an external cavity is used as a master laser and the output from the mode-locked laser diode is amplified by a semiconductor optical amplifier (SOA).

Referring to FIG. 1, an exemplary configuration of the pulse generator having the MOPA system will now be described. FIG. 1 is a schematic diagram illustrating an exemplary configuration of the pulse generator having the MOPA system. It is also noted that the MOPA system applied to a pulse generator 10 according to the present embodiment is not limited to the configuration shown in FIG. 1. Any known MOPA system may be applied to the pulse generator 10.

Referring to FIG. 1, the pulse generator 10 according to an embodiment of the present disclosure includes a mode-locked oscillator 110, lenses 120a, 120b, and 120c, an isolator 130, a prism pair 140, a $\lambda/2$ plate 150, and an SOA 160. FIG. 1 illustrates a configuration of the pulse generator 10 that emits pulsed blue light (pulsed light with a wavelength ranging from about 350 nm to about 500 nm) as an example of the pulse generator 10 according to the present embodiment. However, the pulse generator 10 according to the present embodiment is not limited to the configuration that emits pulsed blue light, and thus it may have a configuration that emits pulsed light of other wavelength bands. In addition, when the pulse generator 10 emits pulsed light of other wavelength bands, the optical property of each component constituting the pulse generator 10 may be appropriately adjusted depending on the wavelength band of the emitted pulsed light. In the following description, the blue light indicates the light with a wavelength ranging from about 350 nm to about 500 nm, unless otherwise specified.

The mode-locked oscillator 110 emits pulsed laser light by causing the output of a semiconductor laser that emits light with a predetermined wavelength to be resonated by a cavity structure. The mode-locked oscillator 110 includes a laser diode 111, a collimator lens 112, a band pass filter (BPF) 113, and an output mirror 114.

The laser diode 111 is, in the present embodiment, a bisectional-laser diode (BS-LD) made of GaInN as a main material. In addition, the laser diode 111 can function as a mode-locked laser diode (MLLD) and emit pulsed light with a wavelength band ranging from about 350 nm to about 500 nm.

The pulsed light emitted from the laser diode 111 passes through the collimator lens 112, the band pass filter 113, and the output mirror 114, and then is emitted from the mode-locked oscillator 110. The pulsed light emitted from the mode-locked oscillator 110 is adjusted to a wavelength of, for example, about 405 nm by the band pass filter 113.

The pulsed light emitted from the laser diode 111 sequentially passes through the lens 120a, the isolator 130, the prism pair 140, the $\lambda/2$ plate 150, and the lens 120b which are provided in the subsequent stage, and then is incident on the SOA 160. The polarization direction of the pulsed light is adjusted by the $\lambda/2$ plate 150. In addition, the coupling efficiency of the pulsed light incident on the SOA is improved by allowing the pulsed light to pass through the prism pair 140. The pulsed light amplified by the SOA 160 is emitted to the outside via the lens 120c.

In the above, an exemplary configuration of the pulse generator 10 according to an embodiment of the present disclosure has been described with reference to FIG. 1. In the pulse generator 10 having the MOPA system as described above, it is possible to generate the pulsed light having the power of about 100 W and the pulse time width of about 3 ps.

In this regard, even for the pulse generator 10 shown in FIG. 1, there is a big demand that the pulse time width of the pulsed light is to be shortened and high power pulsed light is to be obtained. Therefore, the present inventors further considered a method of compressing the pulsed light emitted from the pulse generator 10.

[1.2. Pulse Compression Method]

As a method of performing pulse compression for pulsed light using a solid-state laser, methods of using a prism pair and using a grating pair are known. These pulse compression methods will now be briefly described.

Figure 2:
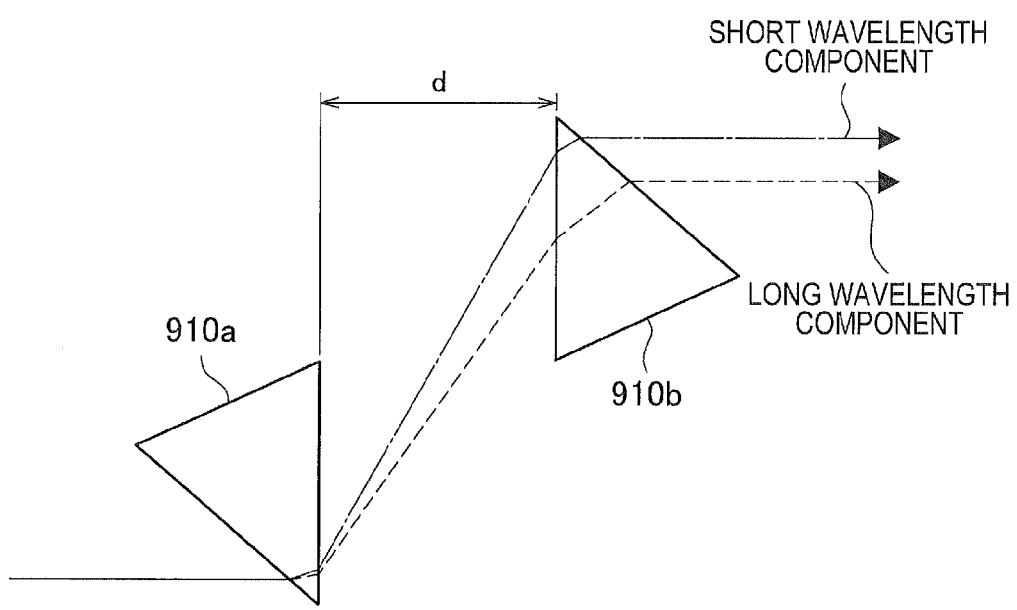
FIG. 2 is a diagram for explaining a pulse compression method using a prism pair.

Referring to FIG. 2, a pulse compression method of using a prism pair will now be described. FIG. 2 is a diagram for explaining the pulse compression method using a prism pair. For example, as shown in FIG. 2, pulsed light is incident on a pair of prisms 910*a* and 910*b* arranged at a distance d from each other. The incident pulsed light is split within the prism into a relatively long wavelength light (light with a long wavelength component) and a relatively short wavelength light (light with a short wavelength component) which propagate along different optical paths from each other. For example, in the example shown in FIG. 2, an optical distance (optical path length) over which the light with a short wavelength component propagates is longer between the prisms 910*a* and 910*b* than an optical distance over which the light with a long wavelength component propagates. An optical distance (optical path length) over which the light with a short wavelength component propagates is shorter in the prism 910*b* than an optical distance over which the light with a long wavelength component propagates. In this way, the optical distance over which the light with a long wavelength component of the pulsed light incident on the pair of prisms 910*a* and 910*b* travels is different from the optical distance over which the light with a short wavelength component of the pulsed light incident on the pair of prisms 910*a* and 910*b* travels. Thus, it is possible to control the difference between the optical path lengths by controlling the distance d between the prisms 910*a* and 910*b*, the refractive index of each prism, or the like.

On the other hand, for example, in the pulsed light having a positive chirp, it is known that a short wavelength component is located near the rear end of the pulse and a long wavelength component is located near the front end of the pulse. Accordingly, the incident pulsed light can be temporally compressed by arranging the prisms 910*a* and 910*b* so that an optical path length of light with a short wavelength component and an optical path length of light with a long wavelength component are in a desired relationship. Thus, the pulse compression method using a prism pair imparts negative dispersion as the frequency dispersion state.

Figure 3:
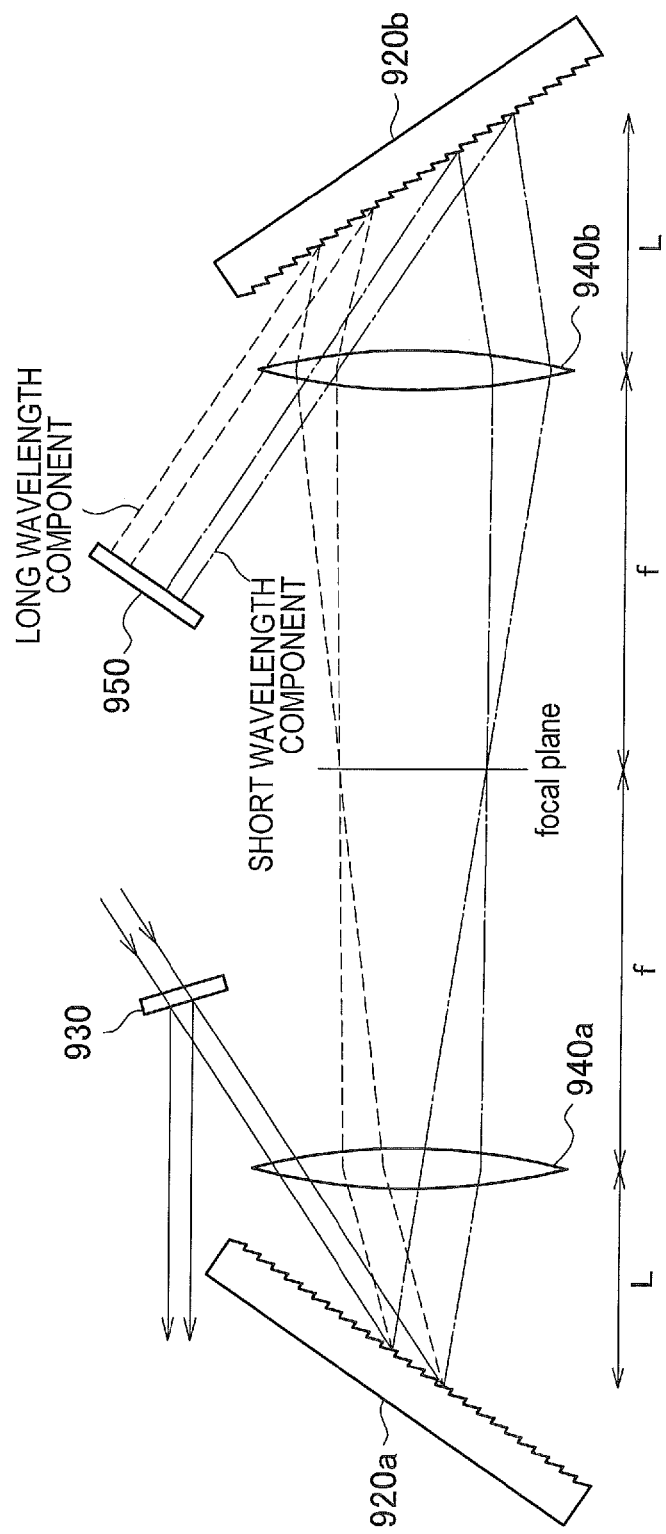
FIG. 3 is a diagram for explaining a pulse compression method using a grating pair.

Next, referring to FIG. 3, a pulse compression method using a grating pair will now be described. FIG. 3 is a diagram for explaining the pulse compression method using a grating pair. In this method, as shown in FIG. 3, a pair of gratings 920*a* and 920*b* are arranged at a predetermined distance in a state in which a surface (reflective surface) of each grating on which a groove (grating) is formed faces to each other, and each grating is inclined at a predetermined angle with respect to an optical axis. Furthermore, a pair of spherical lenses 940*a* and 940*b* are provided between the gratings 920*a* and 920*b*. Specifically, a spherical lens 940*a* is arranged at a predetermined distance L from the grating 920*a* in a position facing a reflective surface of the grating 920*a*. Similarly, a spherical lens 940*b* is arranged at a predetermined distance L from the grating 920*b* in a position facing a reflective surface of the grating 920*b*. In addition, the distance between the spherical lenses 940*a* and 940*b* is adjusted to be a distance (2f) of two times the focal length f of the spherical lenses 940*a* and 940*b*.

The pulsed light, which is incident on the grating 920*a* at a predetermined incident angle, is reflected and diffracted by the reflective surface of the grating 920*a*, passes through the spherical lenses 940*a* and 940*b* sequentially, and then is incident on an reflective surface of the grating 920*b*. The pulsed light incident on the grating 920*b* is further reflected and diffracted by the reflective surface of the grating 920*b*, and then is emitted toward the outside. The pulsed light, which is emitted from the grating 920*b*, is reflected by a mirror 950 and then travels reversely along the optical path over which the light travels before reflection by the mirror 950. In other words, the pulsed light is reflected and diffracted by the reflective surface of the grating 920*b*, passes through the spherical lenses 940*b* and 940*a* sequentially, is further reflected and diffracted by the reflective surface of the grating 920*a*, is reflected by a mirror 930, and then is taken out to the outside.

In a series of procedures of propagating the pulsed light as described above, when the pulsed light is diffracted by the gratings 920*a* and 920*b*, the pulsed light is diffracted in different directions depending on a wavelength of each of the diffracted lights, and thus the diffracted pulsed lights travel along optical paths different from each other for each wavelength. For example, FIG. 3 illustrates, as an example of optical paths different from each other, an optical path through which light with a short wavelength component passes and an optical path through which light with a long wavelength component passes. In this example, according to the pulse compression method using the grating pair shown in FIG. 3, it is possible to adjust the optical path length of light with a long wavelength component and the optical path length of light with a short wavelength component. This adjustment of the optical path length is achieved by adjusting the distance L between the grating 920*a* and the spherical lens 940*a*, and the distance L between the grating 920*b* and the spherical lens 940*b*. Specifically, it is possible to impart positive dispersion to the pulsed light by adjusting the distance L so that the distance L is less than the focal length f (L<f). In addition, it is possible to impart negative dispersion to the pulsed light by adjusting the distance L so that the distance L is greater than the focal length f (L>f). In this way, the incident pulsed light can be temporally compressed by arranging the gratings 920*a* and 920*b* and the spherical lenses 940*a* and 940*b* so that the optical path of light with a short wavelength component and the optical path of light with a long wavelength component are in a desired relationship.

The present inventors have tried to perform pulse compression on the pulsed blue light emitted from the pulse generator 10 shown in FIG. 1 by employing the pulse compression method using a prism pair and the pulse compression method using a grating pair. As a result, in the pulse compression method using a grating pair, it is found that the pulsed blue light has low transmittance in the grating, and thus the pulse compression method using a grating pair is inefficient as a pulse compression method.

Figure 4:
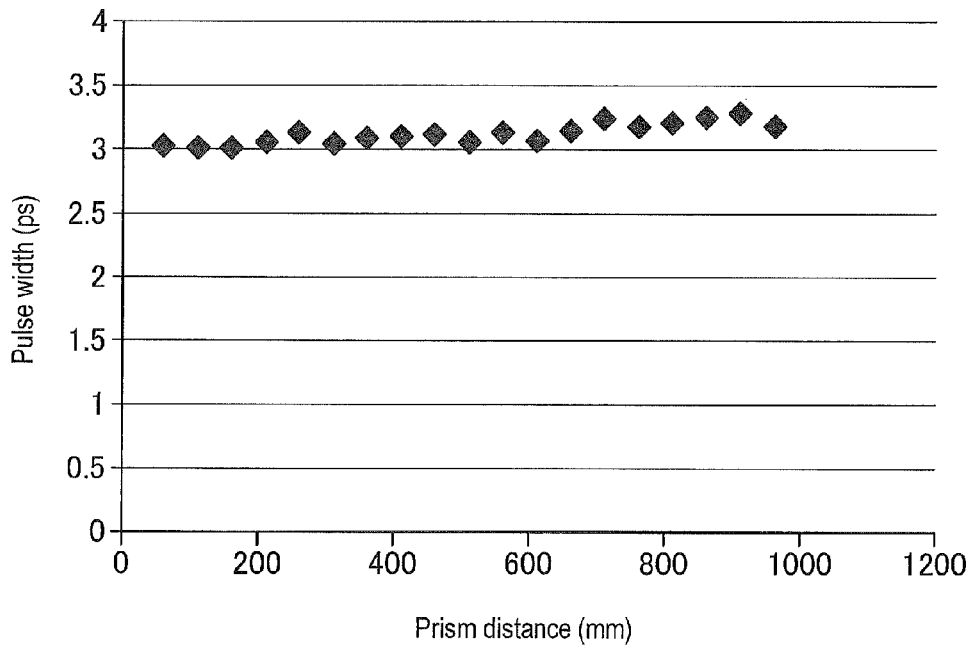
FIG. 4 is a diagram illustrating the result of pulse compression using a prism pair for pulsed blue light using a semiconductor laser.

On the other hand, the effect of pulse compression has not been obtained by the pulse compression method using a prism pair as shown in FIG. 4. FIG. 4 is a diagram illustrating the result of pulse compression using a prism pair for pulsed blue light using a semiconductor laser.

In FIG. 4, the result of pulse compression for pulsed blue light using a semiconductor laser is plotted, where the horizontal axis represents a distance between prisms in the prism pair and the vertical axis represents a pulse time width of the result obtained by performing the pulse compression. As shown in FIG. 4, even when the distance between the prisms is changed, the pulse time width is not changed substantially. From this, it can be seen that the effect of pulse compression is not sufficiently obtained by the pulse compression method using the prism pair with respect to the pulsed blue light using a semiconductor laser.

From the result of this consideration, it can be said that the pulse compression method using the prism pair and the pulse compression method using the grating pair are not an effective pulse compression method with respect to the pulsed blue light using a semiconductor laser.

In this regard, as described above, it is known that the pulse compression method using the prism pair imparts negative dispersion as a frequency dispersion state. Accordingly, as shown in FIG. 4, it can be considered that the pulsed blue light using a semiconductor laser has a negative dispersion state as the frequency dispersion state from the fact that the effect of pulse compression is not sufficiently obtained by the pulse compression method using the prism pair.

From the above consideration, the present inventors have conceived the idea that it is effective to use an optical member configured to impart a positive dispersion state as the frequency dispersion state in order to compress the pulsed blue light using a semiconductor laser. Additionally, in the above consideration, the consideration has been made by taking, as an example, a case of using the pulsed blue light as the pulsed light using a semiconductor laser. However, more generally, it is considered that it is possible to perform pulse compression for the pulsed light using a semiconductor laser, by using an optical member configured to impart a frequency dispersion state opposite to the frequency dispersion state of the pulsed light.

Figure 5:
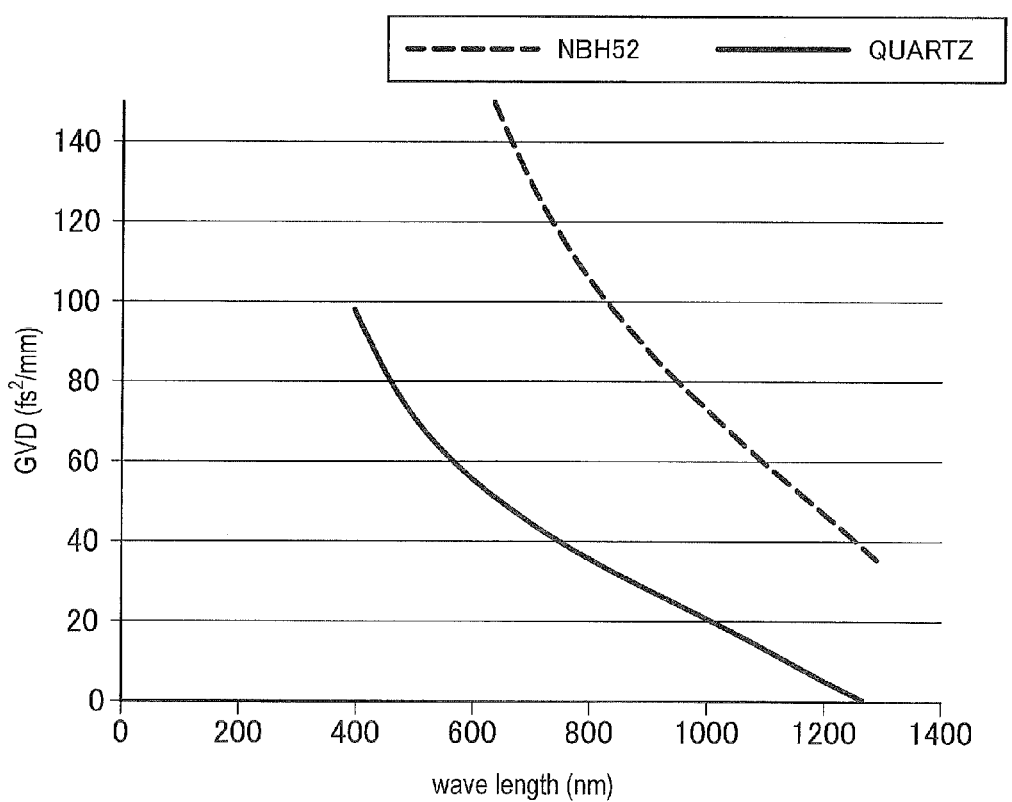
FIG. 5 is a diagram illustrating the wavelength dependence of a dispersion value of quartz glass and NBH52.

The present inventors have considered quartz glass and NBH52 that is a type of optical glass as an example of materials to be used in such an optical member. For quartz glass and NBH52, the result obtained by considering the amount of dispersion to be given to the pulsed light in the pulse compression is illustrated in FIG. 5. FIG. 5 is a diagram illustrating the wavelength dependence of the amount of dispersion of quartz glass and NBH52.

Referring to FIG. 5, properties of quartz glass and NBH52 are plotted, where the horizontal axis represents a wavelength (nm) of pulsed light and the vertical axis represents the amount of dispersion (GVD: Group Velocity Dispersion) (fs$^2$/mm) to be given to the pulsed light of the corresponding wavelength. In FIG. 5, there is illustrated the degree of compression for the pulsed light is large as the value of the vertical axis is large, that is, the amount of dispersion is large.

Meanwhile, quartz glass and NBH52 have the wavelength dependence even for the absorption rate of light. Specifically, blue light (for example, light with a wavelength of 405 nm) has a higher absorption rate for NBH52 than an absorption rate for quartz glass. On the other hand, red light (for example, light with a wavelength of 780 nm) has a substantially similar absorption rate for both NBH52 and quartz glass, and thus the absorption rate is low compared to the case of light with the wavelength of 405 nm.

In this regard, a material of an optical member to be used in pulse compression is necessary to simultaneously satisfy both properties of a large amount of dispersion and low absorption rate. This is because it is possible to perform pulse compression more efficiently as the amount of dispersion shown in FIG. 5 is larger, and it is possible to suppress loss when the pulsed light is incident as the absorption rate is lower. However, there is wavelength dependence in the amount of dispersion and the absorption rate of light, and thus any suitable material can be selected depending on the wavelength of incident light.

For example, it is assumed that a case where pulsed blue light (for example, light with a wavelength of 405 nm) is used as the pulsed light. In this case, if NBH52 is used as an optical material, the amount of dispersion is large while the absorption rate is high, and thus loss is large. Accordingly, it is preferable to use quartz glass having a lower absorption rate.

Furthermore, for example, it is assumed that a case where pulsed red light (for example, light with a wavelength of 780 nm) is used as pulsed light. In this case, as described above, the absorption rate of NBH52 is substantially similar to that of quartz glass. Accordingly, it is preferable to use NBH52 having a large amount of dispersion.

As described above, as a material of an optical member to be used in pulse compression, it is possible to select a suitable material by considering the amount of dispersion and absorption rate thereof depending on a wavelength of the pulsed light to be subject to pulse compression. In addition, as an example of materials of an optical member, the amounts of dispersion of quartz glass and NBH52 are shown in FIG. 5, however the wavelength dependence of the amount of dispersion and absorption rate thereof can be obtained even for other materials based on experimental values, calculated values (simulation values), literature values, or the like. Therefore, with respect to pulsed light of any wavelength, it becomes possible to select a suitable material as an optical member to be used in pulse compression.

As described above, the present inventors have conceived the following method as a result of considering a method of pulse compression for the pulsed light using a semiconductor laser. In other words, it is possible to perform pulse compression by using an optical member configured to impart a frequency dispersion state opposite to the frequency dispersion state of the pulsed light to the pulsed light using the semiconductor laser. In addition, a material of the optical member can be appropriately selected depending on the wavelength of the pulsed light by considering the absorption rate of light or the amount of dispersion.

For example, in a case where the pulsed light using the semiconductor laser is the pulsed blue light that is generated by the pulse generator 10 having the MOPA system illustrated in FIG. 1, the pulsed light has a negative dispersion state as the frequency dispersion state. Thus, it is possible to compress the pulsed light by using materials capable of imparting positive dispersion as a material of the optical member. In addition, it is preferable to use quartz glass for the pulsed blue light from among such materials.

In the following, a preferable embodiment will be described in detail for the pulse compression method conceived by the present inventors from the above consideration. In first and second embodiments mentioned below, the description will be given by taking, as an example, a case where the pulsed light using a semiconductor laser is the pulsed blue light generated by the pulse generator 10 having the MOPA system illustrated in FIG. 1.

<2. First Embodiment>

Figure 6:
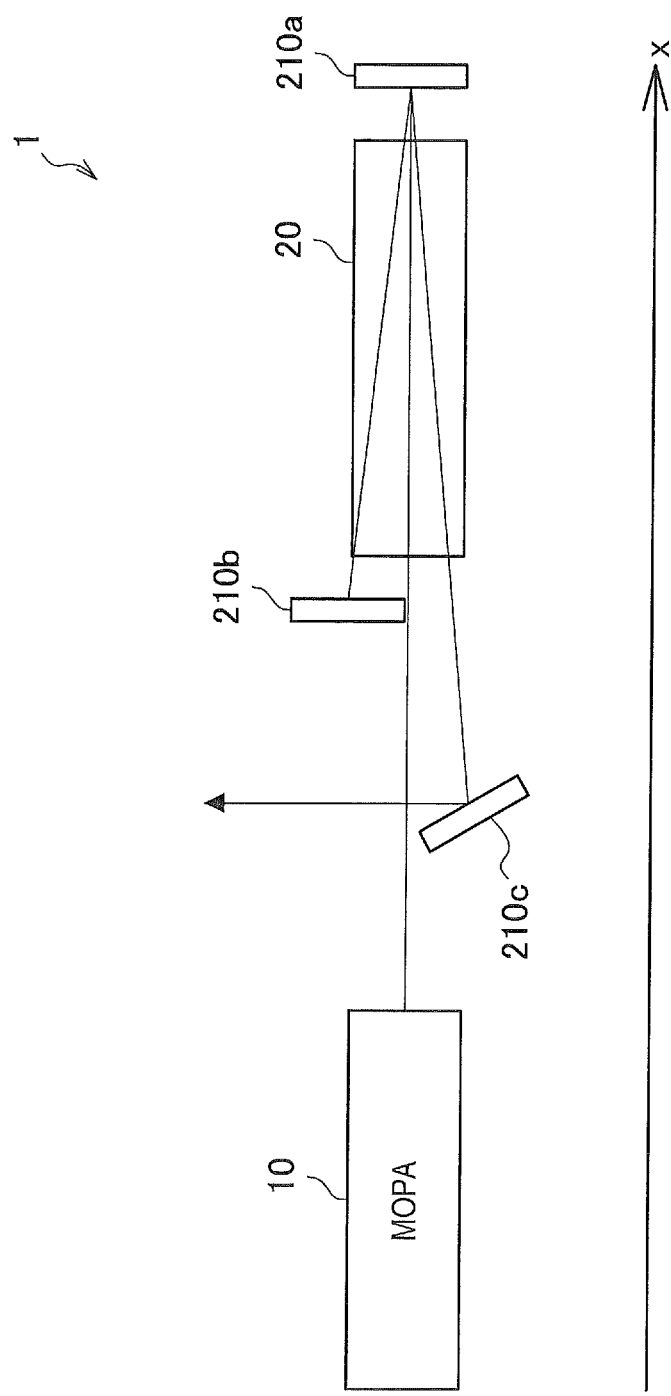
FIG. 6 is a schematic diagram illustrating an exemplary configuration of a pulse shaping device according to a first embodiment of the present disclosure.

The first embodiment of the present disclosure will be described with reference to FIG. 6. FIG. 6 is a schematic diagram illustrating an exemplary configuration of a pulse shaping device according to the first embodiment of the present disclosure. Note that, in the first and second embodiments mentioned below, the description will be given on the premise that the direction from the pulse generator toward the optical member provided in the subsequent stage of the pulse generator is the x-axis.

Referring to FIG. 6, the pulse shaping device 1 according to the first embodiment of the present disclosure includes the pulse generator 10, an optical element 20 made of quartz glass, and mirrors 210a, 210b, and 210c.

The pulse generator 10 generates pulsed light by using a semiconductor laser that emits light with a predetermined wavelength. In the first embodiment, the pulse generator 10 has, for example, the MOPA system shown in FIG. 1 and emits pulsed blue light.

The optical element 20 made of quartz glass is an example of the optical members made of quartz glass which is used to perform pulse compression, and this optical element 20 is a block-like member formed of quartz glass (quartz glass block) in the example shown in FIG. 6. Moreover, each of the mirrors 210a and 210b is provided in the previous and subsequent stages respectively on the optical axis of the optical element 20 made of quartz glass so that the optical element 20 made of quartz glass is interposed between these mirrors.

In this regard, as described in the above item <1. Consideration on Pulse Compression for Pulsed Light using Semiconductor Laser>, it is considered that a frequency dispersion state of the emitted pulsed light in the pulse generator 10 is a negative dispersion state. Thus, it is possible to impart positive dispersion to the pulsed light, and it is possible to perform the pulse compression more efficiently by using the optical member constituted by quartz glass having a relatively low absorption rate.

Specifically, as shown in FIG. 6, the pulsed light emitted from the pulse generator 10 is incident on the optical element 20 made of quartz glass while propagating in the forward direction of the x-axis. The pulse time width of the pulsed light is compressed by passing through the inside of the optical element 20 made of quartz glass.

Furthermore, in the first embodiment, as shown in FIG. 6, the pulsed light passed through the inside of the optical element 20 made of quartz glass is reflected by the mirror 210a provided in the subsequent stage of the optical element 20 made of quartz glass. The pulsed light reflected by the mirror 210a is again incident on the optical element 20 made of quartz glass while propagating in the reverse direction of the x-axis. Then, the pulsed light passed through the inside of the optical element 20 made of quartz glass in the reverse direction of the x-axis is again reflected by the mirror 210b provided in the previous stage of the optical element 20 made of quartz glass. In other words, the pulsed light emitted from the pulse generator 10 passes through the inside of the optical element 20 made of quartz glass to reciprocate in the x-axis direction by allowing the mirrors 210a and 210b to reflect the pulsed light.

The distance (optical path length) over which the pulsed light passes through the inside of the optical element 20 made of quartz glass can be adjusted by adjusting the size of the optical element 20 made of quartz glass and the arrangement position and angle of the mirrors 210a and 210b. As will be described later with reference to FIG. 7A, the degree of the pulse time width to be compressed by the pulse compression is dependent on the optical path length over which light passes through the inside of the optical member. Accordingly, it is possible to control the degree of pulse compression by adjusting the size of the optical element 20 made of quartz glass and the arrangement position and angle of the mirrors 210a and 210b.

In the example shown in FIG. 6, the pulsed light propagated along a desired optical path length by the mirrors 210a and 210b finally propagates through the inside of the optical element 20 made of quartz glass in the reverse direction of the x-axis, and then is taken out in an optional direction by the mirror 210c provided between the pulse generator 10 and the optical element 20 made of quartz glass. In this way, the configuration that finally takes out the light propagated in the reverse direction of the x-axis is referred to as a reflective take-out configuration in the following description. The pulsed light taken out by the mirror 210c is guided to other optical apparatus (not shown) provided in the further subsequent stage of the pulse shaping device 1, and may be used as a light source of the other optical apparatus.

Figure 7A:
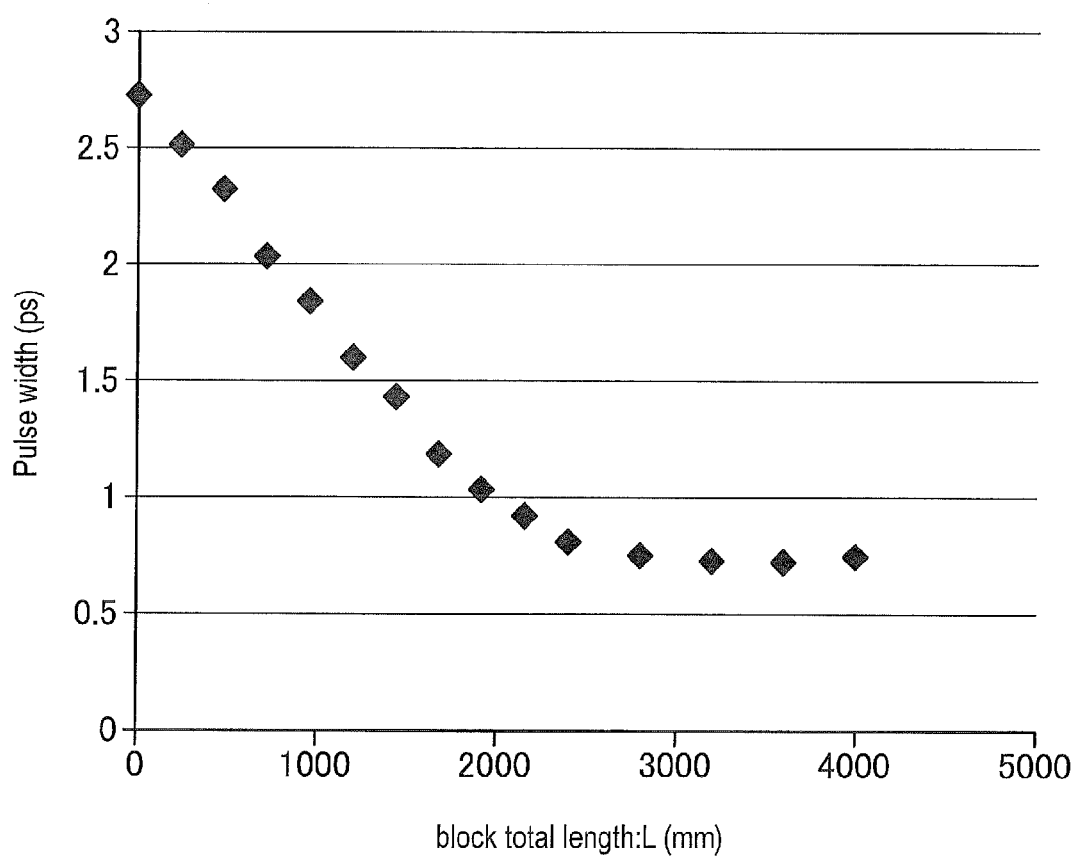
FIG. 7A is a diagram illustrating the effect of pulse compression by the pulse shaping device according to the first embodiment of the present disclosure.

The effect of pulse compression by the pulse shaping device 1 according to the first embodiment will be described with reference to FIGS. 7A and 7B. FIGS. 7A and 7B are diagrams showing the effect of pulse compression by the pulse shaping device 1 according to the first embodiment of the present disclosure.

FIG. 7A illustrates a graph of plotting the relationship between an optical path length over which pulsed light is propagated through the inside of the optical element 20 made of quartz glass (quartz glass block) and a pulse time width of the pulsed light. In this graph, the horizontal axis represents the optical path length and the vertical axis represents the pulse time width. Referring to FIG. 7A, it can be seen that the relationship where the pulse time width is decreased monotonically as the optical path length is longer is satisfied until the optical path length reaches about 2500 mm. Meanwhile, if the optical path length exceeds about 2500 mm, the pulse time width is not changed substantially. In the example shown in FIG. 7A, in a case where the optical path length is 0 mm, that is, when pulsed light does not pass through the optical element 20 made of quartz glass, the pulse time width is about 2.8 ps. Then, the pulse time width is compressed to about 0.72 ps at the most compressed point where the optical path length is about 2500 mm or more.

The relationship shown in FIG. 7A is a relationship between the optical path length and the pulse time width in a case where the pulsed light is blue light with a wavelength of 405 nm and the optical member is the quartz glass block. If a wavelength of pulsed light or a material of the optical member is changed, the relationship between them is changed accordingly. However, it is possible to determine a material of the optical member and optical path length which are optimal to perform a desired pulse compression for pulsed light of each wavelength by obtaining a relationship similar to that of FIG. 7A by experiments, simulations, or the like.

FIG. 7B illustrates a pulse correlation waveform before and after passing through the optical element 20 made of quartz glass when the optical path length of pulsed light within the optical element 20 made of quartz glass (quartz glass block) is 3200 mm. In this regard, the pulse correlation waveform is plotted to take time (ps) by the horizontal axis and take light intensity (a.u.) by the vertical axis with respect to a pulse for one wavelength (one pulse) included in the pulsed light. However, in FIG. 7B, the light intensity (a.u.) represented in the vertical axis is normalized for the output of the pulsed light so that its minimum value is 0 and its maximum value is 1 so as to make it easy to compare with the pulse time width. Referring to FIG. 7B, it can be seen that the pulse time width is compressed to about ¼ by the pulse shaping device 1 according to the first embodiment.

Further, for the transmittance of the pulsed light in the optical element 20 made of quartz glass of the pulse shaping device 1, the difference from the case of using other optical members was examined. As a result, the transmittance of the case of using a general glass member as the optical member was about 20% and the transmittance of the case of using a general grating pair as the optical member was about 50%. In contrast, the use of the optical element 20 made of quartz glass made it possible to obtain a high transmittance of about 90%. Accordingly, the pulse shaping device 1 can suppress loss of the pulsed light due to pulse compression, and thus it is possible to perform pulse compression more efficiently.

Figure 8:
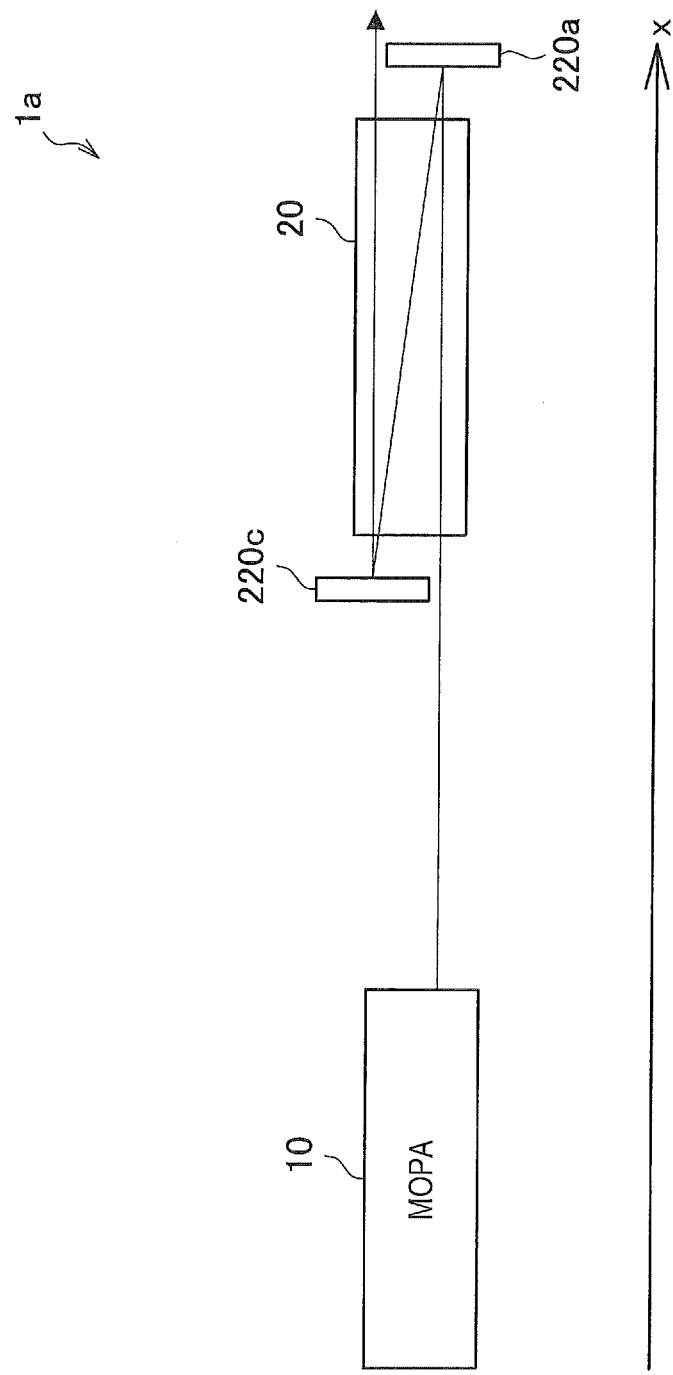
FIG. 8 is a schematic diagram illustrating an exemplary configuration of a modified example of the pulse shaping device according to the first embodiment of the present disclosure.

A modified example of the pulse shaping device 1 according to the first embodiment will now be described with reference to FIG. 8. FIG. 8 is a schematic diagram illustrating an exemplary configuration of a modified example of the pulse shaping device 1 according to the first embodiment of the present disclosure. Note that, in the description of the present modified example, the explanation focuses mainly on the differences between the modified example and the pulse shaping device 1 shown in FIG. 6, and repeated explanation of the same configuration is omitted.

Referring to FIG. 8, a pulse shaping device 1a according to the present modified example includes the pulse generator 10, the optical element 20 made of quartz glass, and mirrors 220a and 220c. In this way, the pulse shaping device 1a according to the present modified example is substantially similar to the pulse shaping device 1 shown in FIG. 6, except for the configuration of the mirrors.

Referring to FIG. 8, in the pulse shaping device 1a, the pulsed light propagated along a desired optical path length by the mirrors 220a and 220c finally propagates through the inside of the optical element 20 made of quartz glass in the forward direction of the x-axis, and then is taken out to the outside. In other words, the pulse shaping device 1a according to the present modified example is different from the pulse shaping device 1 shown in FIG. 6 in that the pulse shaping device 1 has a reflective take-out configuration but the pulse shaping device 1a has a configuration in which light finally propagated in the forward direction of the x-axis is taken out. Thus, in the following description, the configuration in which light finally propagated in the forward direction of the x-axis is taken out is referred to as a transmissive take-out configuration. Even when the pulse shaping device 1a is a pulse shaping device having the transmissive take-out configuration, only the direction in which pulsed light is finally taken out is different, and thus it is possible to obtain the pulse compression effect as shown in FIGS. 7A and 7B.

Furthermore, as a pulse shaping device, determination of whether the reflective take-out configuration is used or the transmissive take-out configuration is used may be appropriately selected depending on the configuration, arrangement, or the like of other optical apparatus to be provided in the subsequent stage of the respective pulse shaping devices.

In the above, the configuration of the pulse shaping devices 1 and 1a according to the first embodiment of the present disclosure and the pulse compression effect thereof have been described with reference to FIGS. 6, 7A, 7B, and 8. As described above, in the pulse shaping device 1 or 1a according to the first embodiment of the present disclosure, the pulse compression is performed by the optical element 20 made of quartz glass (quartz glass block) with respect to the pulsed blue light using a semiconductor laser, which has a negative dispersion state as the frequency dispersion state. Accordingly, it is possible to compress the pulse time width of the pulsed light more efficiently with a simpler structure.

Moreover, in the pulse shaping device 1 or 1a according to the first embodiment, the optical path length over which pulsed light passes through the inside of the quartz glass block is adjusted by the size of the quartz glass block and by the arrangement position and angle of the plurality of mirrors provided in the previous and subsequent stages of the quartz glass block. Thus, it is possible to compress the pulsed light to a desired pulse time width.

In the above description, although the mirrors 210a, 210b and 210c or 220a and 220c are provided in the previous and subsequent stages of the optical element 20 made of quartz glass, the first embodiment is not limited thereto. If it is possible to ensure a desired optical path length only by passing once through the optical element 20 made of quartz glass by adjusting the size of the optical element 20 made of quartz glass, these mirrors may be not provided.

<3. Second Embodiment>

Next, a second embodiment of the present disclosure will be described with reference to FIG. 9. FIG. 9 is a schematic diagram illustrating an exemplary configuration of a pulse shaping device according to the second embodiment of the present disclosure.

Referring to FIG. 9, the pulse shaping device 2 according to the second embodiment of the present disclosure includes the pulse generator 10, a single-mode optical fiber (SMF) 30, and lenses 310a and 310b.

The function and configuration of the pulse generator 10 is substantially similar to those of the first embodiment. In other words, the pulse generator 10 generates pulsed light by using a semiconductor laser for emitting light of a predetermined wavelength. In the second embodiment, the pulse generator 10 has, for example, the MOPA system shown in FIG. 1 and emits pulsed blue light.

The single-mode optical fiber 30 is an example of the optical member made of quartz glass, and a core of the single-mode optical fiber is formed of quartz glass. In addition, the lens 310a is a lens provided to cause light to be incident on the single-mode optical fiber 30, and the lens 310b is a lens provided to cause light to be emitted from the single-mode optical fiber 30 to a member in the subsequent stage. Note that, the configurations of the single-mode optical fiber 30 and the lenses 310a and 310b are not limited to the example shown in FIG. 9, and the configuration of any optical fiber known in the art may be applied.

Similar to the first embodiment, the frequency dispersion state of the pulse generator 10 is considered to be a negative dispersion state. Thus, it is possible to impart positive dispersion to the pulsed light, and it is possible to perform the pulse compression more efficiently by using the optical member constituted by quartz glass having a relatively low absorption rate.

Specifically, as shown in FIG. 9, the pulsed light emitted from the pulse generator 10 is incident on the single-mode optical fiber 30 via the lens 310a while propagating in the forward direction of the x-axis. The pulse time width of the pulsed light is compressed by propagating the core made of quartz glass within the single-mode optical fiber 30. The pulse-compressed pulsed light is then emitted again from the lens 310b toward other optical apparatus or the like provided in the subsequent stage.

The effect of pulse compression by the pulse shaping device 2 according to the second embodiment will now be described with reference to FIG. 10. FIG. 10 is a diagram illustrating the effect of pulse compression by the pulse shaping device 2 according to the second embodiment of the present disclosure. FIG. 10 illustrates a pulse correlation waveform before and after passing through the single-mode optical fiber 30. In this regard, the pulse correlation waveform of FIG. 10 is plotted to take time (ps) by the horizontal axis and take light intensity (a.u.) by the vertical axis with respect to a pulse of one wavelength (one pulse) included in the pulsed light, which is similar to the pulse correlation waveform shown in FIG. 7B.

Referring to FIG. 10, it can be seen that the pulse time width is compressed by the pulse shaping device 2 according to the second embodiment. In the example shown in FIG. 10, the pulse time width was about 2.5 ps before passing through the single-mode optical fiber 30, and the pulse time width is compressed to about 1.2 ps after passing through the single-mode optical fiber 30. In addition, even in the second embodiment, similarly with the first embodiment, the degree of the pulse time width to be compressed by the pulse compression is dependent on the optical path length over which light passes through the optical member (single-mode optical fiber 30). Accordingly, it is possible to control the degree of pulse compression by adjusting the length of the single-mode optical fiber 30.

In the above, the configuration of the pulse shaping device 2 according to the second embodiment of the present disclosure and the pulse compression effect thereof have been described with reference to FIGS. 9 and 10. In the pulse shaping device 2 according to the second embodiment of the present disclosure, the following effects can be obtained, in addition to the effects obtained by the pulse shaping device 1 or 1a according to the first embodiment described in <2. First Embodiment> mentioned above.

As described above, in the pulse shaping device 2 according to the second embodiment of the present disclosure, the single-mode optical fiber 30 is used as an optical member. Thus, when the pulse shaping device 2 is used as a light source of other optical apparatus, the use of the single-mode optical fiber 30 as an optical member makes it possible to flexibly configure the layout of an optical path from the pulse shaping device 2 to the other optical apparatus. In other words, the pulse compression and the light guiding from the pulse shaping device 2 to other optical apparatus can be simultaneously performed by the single-mode optical fiber 30, and thus it is possible to simplify the entire structure of the device (overall configuration including the pulse shaping device 2, other optical apparatus, and other optical elements).

<4. Summary>

As described above, according to the first and second embodiments of the present disclosure, it is possible to obtain the following effects.

In the pulse shaping device 1 or 1a according to the first embodiment of the present disclosure, the pulse compression is performed by the optical element 20 made of quartz glass (quartz glass block) with respect to the pulsed blue light using a semiconductor laser, which has a negative dispersion state as the frequency dispersion state. Accordingly, it is possible to compress the pulse time width of the pulsed light more efficiently with a simpler structure.

Furthermore, in the pulse shaping device 1 or 1a according to the first embodiment, the optical path length over which pulsed light passes through the inside of the quartz glass block is adjusted by the size of the quartz glass block and by the arrangement position and angle of the plurality of mirrors provided in the previous and subsequent stages of the quartz glass block. Thus, it is possible to compress the pulsed light to a desired pulse time width.

Moreover, in the pulse shaping device 2 according to the second embodiment of the present disclosure, the single-mode optical fiber 30 is used as the optical member. Thus, when the pulse shaping device 2 is used as a light source of other optical apparatus, the use of the single-mode optical fiber as the optical member makes it possible to flexibly configure the layout of an optical path from the pulse shaping device 2 to the other optical apparatus.

Further, in the first and second embodiments of the present disclosure, the pulse compression is performed by allowing the pulsed light emitted from the pulse generator 10 to passing through the inside of the optical element 20 made of quartz glass (quartz glass block) or the single-mode optical fiber 30. Accordingly, the pulse compression can be performed with a simpler structure and the cost regarding the device configuration can be reduced, compared to the pulse compression method in the related art.

Although the case where the pulse generator 10 emits pulsed blue light using the semiconductor laser has been described in the above first and second embodiments, the present disclosure is not limited thereto. The pulse generator 10 may emit pulsed light of other wavelength bands. Even when the pulse generator 10 emits pulsed light of a wavelength band other than the blue color wavelength, it is possible to perform pulse compression by using an optical member configured to impart a frequency dispersion state opposite to the frequency dispersion state of the pulsed light to the pulsed light using the semiconductor laser. In addition, a material of the optical member can be appropriately selected by considering the absorption rate and amount of dispersion thereof depending on the wavelength of the pulsed light. For example, in a case where the pulse generator 10 emits pulsed red light (for example, light with a wavelength of 780 nm), NBH52 can be used as an example of an optical member for performing pulse compression.

Although preferred embodiments of the present disclosure are described in detail with reference to the accompanying drawings, the technical scope of the present disclosure is not limited thereto. It should be understood by those skilled in the art that various modifications, combinations, sub-combinations and alterations may occur depending on design requirements and other factors insofar as they are within the scope of the appended claims or the equivalents thereof.

For example, in the above first and second embodiments of the present disclosure, as shown in FIGS. 6, 8 and 9, the mirrors 210a, 210b and 210c or 220a and 220c, or the lenses 310a and 310b are used as an optical element other than the optical element 20 made of quartz glass and the single-mode optical fiber 30. However, the present disclosure is not limited to such a configuration. For example, in the previous and/or subsequent stage of performing the pulse compression, various types of optical elements commonly used, such as a lens, a mirror, and different types of filters, can be further provided in order to control the behavior of the pulsed light.

Additionally, the present application may also be configured as below.

(1) A pulse shaping device including:
   a pulse generator configured to generate pulsed light by using a semiconductor laser for emitting light of a predetermined wavelength; and
   an optical member provided in a subsequent stage of the pulse generator and configured to compress a pulse time width of the pulsed light,
   wherein the pulsed light has a first frequency dispersion state, and
   wherein the optical member imparts a second frequency dispersion state to the pulsed light, the second frequency dispersion state being a frequency dispersion state opposite to the first frequency dispersion state.

(2) The pulse shaping device according to (1),
   wherein the pulsed light has a wavelength ranging from 350 nm to 500 nm,
   wherein the first frequency dispersion state is negative dispersion, and
   wherein the optical member compresses the pulsed light by imparting positive dispersion as the second frequency dispersion state.

(3) The pulse shaping device according to (2), wherein the optical member is an optical member made of quartz glass.

(4) The pulse shaping device according to (3), wherein the optical member is an optical element made of quartz glass.

(5) The pulse shaping device according to (3), wherein the optical member is a single-mode optical fiber.

(6) The pulse shaping device according to any one of (1) to (5), wherein a degree to which the pulse time width of the pulsed light is compressed is changed depending on an optical path length over which the pulsed light passes through the optical member.

(7) The pulse shaping device according to any one of (1) to (6), wherein the pulse generator includes a master oscillator power amplifier (MOPA) system for allowing an output from a mode-locked laser diode (MLLD) to be amplified by a semiconductor optical amplifier (SOA) by using the mode-locked laser diode for allowing the semiconductor laser to be operated in a form of an external cavity.

(8) A pulse shaping device including:
a pulse generator configured to generate pulsed light by using a semiconductor laser for emitting light with a wavelength ranging from 350 nm to 500 nm;
a quartz glass block provided in a subsequent stage of the pulse generator; and
a mirror disposed on at least one of previous and subsequent stages of the quartz glass block and configured to reflect pulsed light emitted from the pulse generator,
wherein the pulsed light propagates through an inside of the quartz glass block only along a predetermined optical path length by being reflected by the mirror.

(9) A pulse shaping device including:
a pulse generator configured to generate pulsed light by using a semiconductor laser for emitting light with a wavelength ranging from 350 nm to 500 nm;
a single-mode optical fiber provided in a subsequent stage of the pulse generator;
a first lens configured to guide the pulsed light to the single-mode optical fiber; and
a second lens configured to emit the pulsed light from the single-mode optical fiber.

(10) A pulse shaping method including:
generating pulsed light by using a semiconductor laser for emitting light of a predetermined wavelength; and
compressing a pulse time width of the pulsed light by allowing the pulsed light to pass through an inside of an optical member,
wherein the pulsed light has a first frequency dispersion state, and
wherein the optical member imparts a second frequency dispersion state to the pulsed light, the second frequency dispersion state being a frequency dispersion state opposite to the first frequency dispersion state.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention claimed is:

1. A pulse shaping device comprising:
a pulse generator configured to generate pulsed light by using a semiconductor laser for emitting light of a predetermined wavelength;
an optical member provided in a subsequent stage of the pulse generator, the optical member configured such that the generated pulsed light propagating in a forward direction of the x-axis is incident on the optical member, and the optical member is configured to compress a pulse time width of the pulsed light; and
a mirror disposed in a subsequent stage of the optical member and configured to reflect the generated pulsed light from the optical member such that the reflected light from the mirror propagates through an inside of the optical member,
wherein the pulsed light has a first frequency dispersion state, and
wherein the optical member imparts a second frequency dispersion state to the pulsed light, the second frequency dispersion state being a frequency dispersion state opposite to the first frequency dispersion state.

2. The pulse shaping device according to claim 1,
wherein the pulsed light has a wavelength ranging from 350 nm to 500 nm,
wherein the first frequency dispersion state is negative dispersion, and
wherein the optical member compresses the pulsed light by imparting positive dispersion as the second frequency dispersion state.

3. The pulse shaping device according to claim 2, wherein the optical member is made of quartz glass.

4. The pulse shaping device according to claim 3, wherein the optical member is a single-mode optical fiber.

5. The pulse shaping device according to claim 1, wherein a degree to which the pulse time width of the pulsed light is compressed is changed depending on an optical path length over which the pulsed light passes through the optical member.

6. The pulse shaping device according to claim 1, wherein the pulse generator includes a master oscillator power amplifier (MOPA) system for allowing an output from a mode-locked laser diode (MLLD) to be amplified by a semiconductor optical amplifier (SOA) by using the MLLD for allowing the semiconductor laser to be operated in a form of an external cavity.

7. A pulse shaping device comprising:
a pulse generator configured to generate pulsed light by using a semiconductor laser for emitting light with a wavelength ranging from 350 nm to 500 nm;
a quartz glass block provided in a subsequent stage of the pulse generator, the quartz glass block configured such that the generated pulsed light propagating in a forward direction of the x-axis is incident on the quartz glass; and
a mirror disposed on at least one of previous and subsequent stages of the quartz glass block and configured to reflect pulsed light emitted from the pulse generator,
wherein the pulsed light propagates through an inside of the quartz glass block only along a predetermined optical path length by being reflected by the mirror.

8. A pulse shaping method comprising:
generating pulsed light by using a semiconductor laser for emitting light of a predetermined wavelength, wherein the generated pulsed light propagates in a forward direction of the x-axis and is incident on an optical member;
compressing a pulse time width of the pulsed light by allowing the pulsed light to pass through an inside of the optical member; and
reflecting the generated pulsed light from the optical member, by a mirror disposed subsequent to the optical member, such that the reflected light from the mirror propagates through an inside of the optical member,
wherein the pulsed light has a first frequency dispersion state, and
wherein the optical member imparts a second frequency dispersion state to the pulsed light, the second frequency dispersion state being a frequency dispersion state opposite to the first frequency dispersion state.

* * * * *